(12) United States Patent
Scaman

(10) Patent No.: US 7,360,199 B2
(45) Date of Patent: Apr. 15, 2008

(54) ITERATIVE METHOD FOR REFINING INTEGRATED CIRCUIT LAYOUT USING COMPASS OPTICAL PROXIMITY CORRECTION (OPC)

(75) Inventor: Michael E. Scaman, Goshen, NY (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 11/420,534

(22) Filed: May 26, 2006

(65) Prior Publication Data

US 2007/0277145 A1    Nov. 29, 2007

(51) Int. Cl.
G06F 17/50 (2006.01)
G06K 9/00 (2006.01)

(52) U.S. Cl. ............................... 716/19; 716/4; 716/21; 382/144

(58) Field of Classification Search .................... 716/4, 716/19, 21; 382/144
See application file for complete search history.

(56) References Cited

U.S. PATENT DOCUMENTS

| | | | |
|---|---|---|---|
| 6,249,904 B1 | 6/2001 | Cobb | |
| 6,317,859 B1 * | 11/2001 | Papadopoulou | 716/4 |
| 6,430,737 B1 * | 8/2002 | Cobb et al. | 716/19 |
| 6,467,076 B1 | 10/2002 | Cobb | |
| 6,516,459 B1 * | 2/2003 | Sahouria | 716/21 |
| 6,978,436 B2 * | 12/2005 | Cote et al. | 716/19 |
| 7,013,439 B2 * | 3/2006 | Robles et al. | 716/4 |
| 7,024,655 B2 * | 4/2006 | Cobb | 716/19 |
| 7,149,340 B2 * | 12/2006 | Filseth et al. | 382/144 |
| 7,240,305 B2 * | 7/2007 | Lippincott | 716/4 |
| 2002/0199157 A1 | 12/2002 | Cobb | |
| 2004/0005089 A1 | 1/2004 | Robles et al. | |
| 2004/0088149 A1 | 5/2004 | Cobb | |
| 2004/0221254 A1 | 11/2004 | Cobb | |

* cited by examiner

Primary Examiner—Paul Dinh
Assistant Examiner—Patrick Sandoval
(74) Attorney, Agent, or Firm—James J. Cioffi; Hoffman, Warnick & D'Alessandro LLC (57) ABSTRACT

The present invention is an iterative method or procedure involving a series of optical proximity correction (OPC) process steps for refining an integrated circuit design layout on a wafer during a photolithographic process. The iterative method may be applied as a system and computer program to perform classifying and grouping edge fragments according to directional orientations, selecting an edge fragment or a combination of non-opposing edge fragments, calculating an edge placement error of the selected edge fragment and proximally shifting the edge fragment until a quality limitation is met.

7 Claims, 5 Drawing Sheets

ITERATIVE METHOD FOR REFINING INTEGRATED CIRCUIT LAYOUT USING COMPASS OPTICAL PROXIMITY CORRECTION (OPC)

BACKGROUND OF THE INVENTION

1. Technical Field

The invention relates generally to a method of fabricating a mask using a lithography technique in semiconductor fabrication. Particularly, to an iterative method of refining an integrated circuit (IC) design layout based on optical proximity correction (OPC), where edge fragments are grouped accordingly in non-opposing directional orientations.

2. Background Art

The trend of decreasing conductive feature size and increasing feature density in semiconductor devices diminishes the precision of lithographic printing compromising yield or reliability. As the critical dimension (CD) of conductive features continues to shrink far beyond a submicron scale crossing into or below the wavelength of light, distortions of the aerial image of the IC design to the target layout in the lithographic printing process are unavoidable. Such distortions may lead to overlap of conductive features. To minimize such optical distortions, resolution enhancement techniques (RET) including phase shift and optical proximity correction (OPC) are employed to attain greater precision towards the ideal properties of the lithography process.

To a person skilled in the art, an IC design or layout is composed of numerous polygons made up of edge fragments. To enable compensation of optical distortions, these edge fragments are fragmentized and shifted in small increments. Typically, OPC is divided into model-based (MBOPC) or rule-based (RBOPC). MBOPC applies computationally intensive simulations of an edge placement error determined for every edge in the IC design to compensate for the error through a series of iterations. Due to computational requirements, MBOPC is time consuming. RBOPC extends from manual OPC where alterations of every particular shape of fragmented polygon in an IC design is set according to a pre-determined rule. RBOPC techniques, though faster, strongly depend on empirical knowledge for an accurate correction.

For the MBOPC technique, consideration of the deleterious effects of the edge placement error shift of neighboring edge fragments is not included in the simulations of a particular edge fragment. This poses problems in convergence, accuracy of fit and adhering to mask rule checks (MRC). When an edge fragment shifts simultaneously with neighboring edge fragments, comparison of positions between the moving edge fragments adds to computational complexities because of the interdependency between the edge fragments. Edge placement error (EPE) shifts of surrounding edge fragments may conflict with efforts to minimize the edge placement error of a particular edge fragment. Accuracy is compromised at roughly half a grid point times the sensitivity of the fragment movement to edge placement error (EPE) with the use of a single fragment to a single target edge. A further limitation is the application of mask rule checks (MRC) for ensuring minimal distance between features, minimal spacing externally and minimum distance of a feature (e.g. a minimum line internally). Generally, repair steps to correct any irregularities may be built into the process which follows from MRC. The complexity of a repair step may add to each iteration step on shifting all edges to verify compliance with MRC and refining intervening problems after all edges have moved before continuing on to another iteration step.

Efforts have been made to reduce the limitations of MBOPC with consideration of classifying edges based on orientation angles and cooperation schemes between neighboring edge fragments on a linear combination of the respective edge placement errors of related edge fragments. However, the additional computational steps in these efforts may create further computational complications. Furthermore, there remains the need to address the effect of edge placement error shifts of opposite edge fragments. Some methods proposed have iterated different categories of fragments by characteristics such as line end, corner, horizontal or vertical, but have never separated this into moving non-opposing fragments that is directionally specific at a time, for example, these prior methods have not separated top fragments from bottom fragments or left fragments from right fragments. Additionally, since conventional OPC will move a fragment based only on the EPE of itself and not its neighbors, there may be an accuracy limit of about half a grid point times the sensitivity of the fragment movement.

In view of the foregoing, there is a need in the art for a solution to the problems of the related art.

SUMMARY OF THE INVENTION

The present invention is an iterative method or procedure involving a series of optical proximity correction (OPC) process steps for refining an integrated circuit design layout on a wafer during a photolithographic process. The iterative method may be applied as a system and computer program to perform classifying and grouping edge fragments according to directional orientations, selecting an edge fragment or a combination of non-opposing edge fragments, calculating an edge placement error of the selected edge fragment and proximally shifting the edge fragment until a quality limitation is met. The iterative method further incorporates mask rule checks (MRC) during or after the shift of each edge fragments to ensure violations of the manufacture rules are corrected.

A first aspect of the invention provides an iterative optical proximity correction (OPC) method for refining an integrated circuit (IC) layout, the IC layout having a plurality of edge fragments, the method comprising: determining a directional orientation of each edge fragment; grouping edge fragments of the same directional orientation to form mutually exclusive directional orientation sets; selecting an edge fragment from one of the mutually exclusive sets; calculating an edge placement error (EPE) of the selected edge fragments; shifting the selected edge fragment based on the calculated EPE to a new position; updating the orientation of the shifted edge fragment; selecting an edge fragment from another one of the mutually exclusive sets; and reiterating calculating the EPE of the edge fragment, shifting edge fragment and updating orientation and selecting of an edge of a different directional orientation to attain a predetermined limit; wherein the reiterating calculating the EPE of the edge fragment alternates between mutually exclusive sets; and wherein the mutually exclusive sets contain edge fragments of non-opposing directional orientation.

A second aspect of the invention provides a system for refining an integrated circuit (IC) layout through an iterative procedure, the IC layout having of a plurality edge fragments, the system comprising: a means for determining a directional orientation of each edge fragment; a means for grouping edge fragments of the same directional orientation to form mutually exclusive directional orientation sets; a means for selecting an edge fragment from one of the mutually exclusive sets; a means for calculating an edge placement error (EPE) of the selected edge fragments; a means for shifting the selected edge fragment based on the calculated EPE to a new position; a means for updating the orientation of the shifted edge fragment; a means for selecting an edge fragment from another one of the mutually exclusive sets; and a means for reiterating calculating the EPE of the edge fragment, shifting edge fragment and updating orientation and selecting of an edge of a different directional orientation until a predetermined limit a reached wherein the means for reiterating calculating the EPE of the edge fragment performs the calculating by alternating between mutually exclusive sets; and wherein the mutually exclusive sets contain edge fragments of non-opposing directional orientation.

In a third aspect of the invention, a computer program stored on a machine-readable medium, for refining an integrated circuit (IC) layout, the IC layout comprising a plurality of edge fragments, the computer program including program code for: determining a directional orientation of each edge fragment; grouping edge fragments of the same directional orientation to form mutually exclusive directional orientation sets; selecting an edge fragment from one of the mutually exclusive sets; calculating an edge placement error (EPE) of the selected edge fragments; shifting the selected edge fragment based on the calculated EPE to a new position; updating the orientation of the shifted edge fragment; selecting an edge fragment from another one of the mutually exclusive sets; and reiterating calculating the EPE of the edge fragment, shifting edge fragment and updating orientation and selecting of an edge of a different directional orientation to attain a predetermined limit; wherein the reiterating calculating the EPE of the edge fragment alternates between mutually exclusive sets; and wherein the mutually exclusive sets contain edge fragments of non-opposing directional orientation.

The illustrative aspects of the present invention are designed to solve the problems herein described and other problems not discussed which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
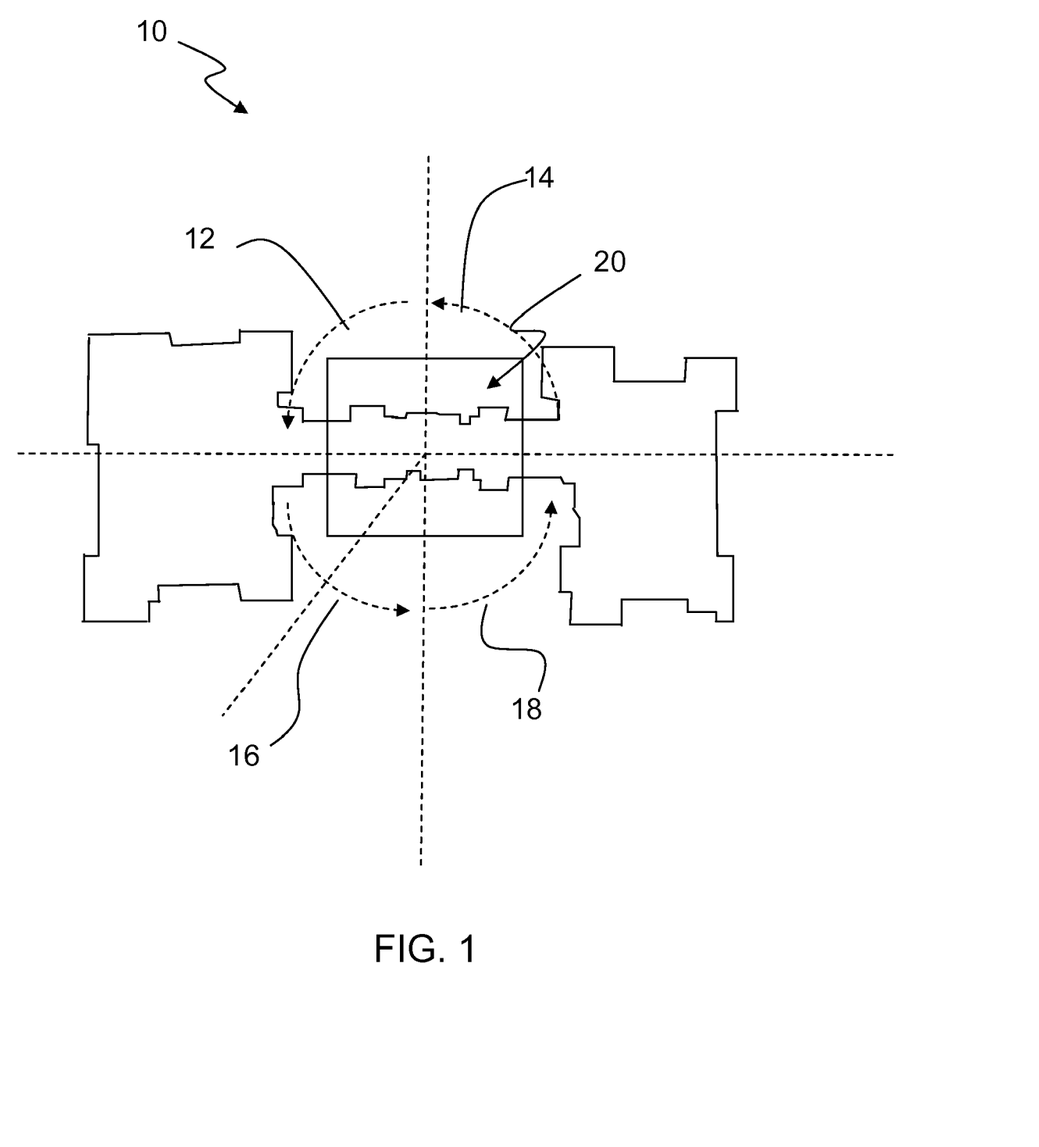
FIG. 1 is a plan view of a fragment of an integrated circuit design for fabricating a semiconductor device in an embodiment of the present invention.

In the fabrication of a semiconductor device, photolithography is applied to create a mask on a wafer (not shown) with the use of a circuit design layout. FIG. 1 illustrates a fragment 10 of a circuit design layout (not shown) in an embodiment of the present invention. As part of the photolithographic process, resolution enhancement techniques (RET) like optical proximity correction (OPC) methods may be applied to a circuit design layout to minimize optical errors that occur when such a layout is projected onto a wafer during the photolithographic process. The method of the present invention provides an iterative procedure where every edge of a fragment is shifted from an original position to a new position that would result in a circuit design layout that is closer to the ideal pattern such that an integrated circuit fabricated with such a layout would produce semiconductor devices of better yield.

Figure 2:
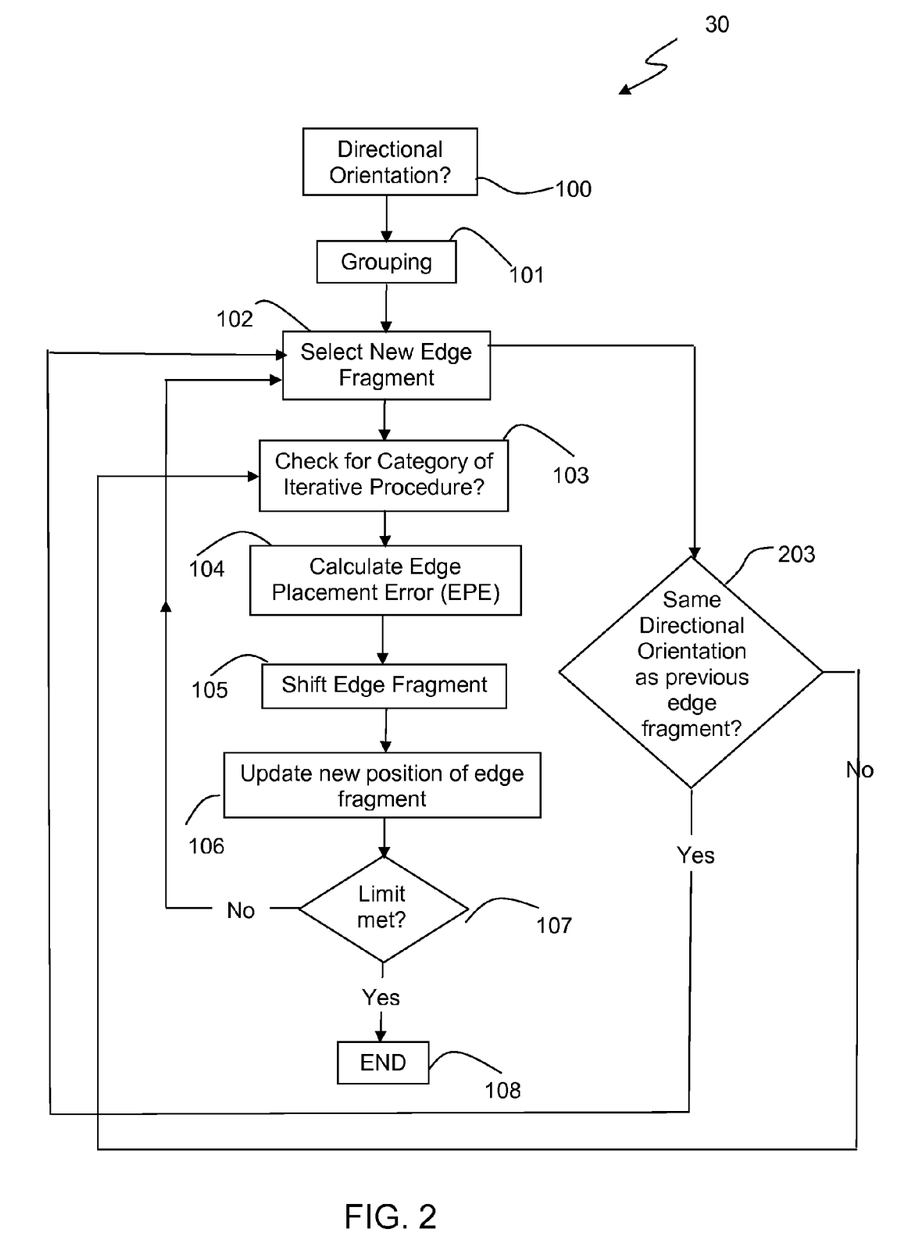
FIG. 2 is an algorithm illustrating an embodiment of the method of the present invention.

The iterative procedure involves a series of process steps illustrated in algorithm 30 in FIG. 2. Every edge fragment is given a classification according to its directional orientation 100. Edge fragments of the same directional orientation are grouped together to form mutually exclusive sets 101 (i.e. edge fragments of a particular orientation and edge fragments of the particular orientation plus 180° are not grouped together in the same directional orientation set). An example of mutually exclusive sets would be those classified as having a "top" directional orientation and those edge fragments classified as having a "bottom" directional orientation. An edge fragment is selected from a particular set of edge fragments 102. Calculation of an edge placement error (EPE) is initiated 104 after a category of iterative procedure is determined 103. The category may be a single sided compass method, a dual sided compass method or a single quadrant compass method, etc. Details of these categories are discussed in later paragraphs with FIG. 4a-4d. With the EPE, the edge fragment is shifted 105 to a new position which is updated 106. A check is made if the iteration meets a pre-determined limitation 107. If the limitation is met, the process ends 108. Where the limit is not met, a new edge fragment is selected 102. The directional orientation of the newly selected edge fragment is compared to the previous edge fragment 203. If the directional orientation is the same, another edge fragment is selected 102. If the directional orientation of the newly selected edge fragment is different from the previously iterated edge fragment, the category of iterative procedure is determined 103 and the EPE is determined 104 prior to shifting the edge fragment 105. The process steps are repeated with each edge fragment accordingly. While an edge fragment is iterated, remaining edge fragments remain in a fixed position. Information of each preceding iteration is made available for subsequent OPC simulations.

Figure 3:
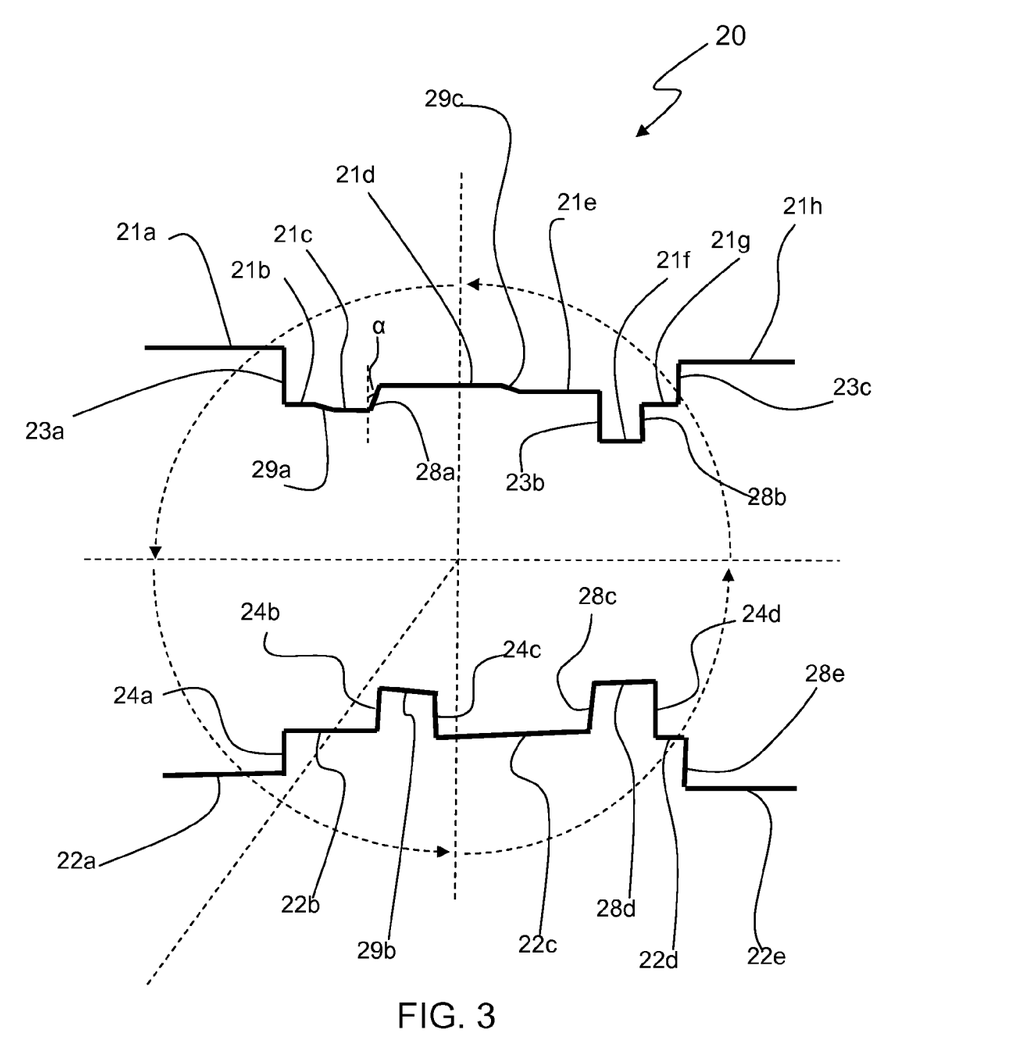
FIG. 3 is a blown-up view of a section of the fragment in FIG. 1.

There are a number of directional orientations in which the edge fragments may be classified. It is appreciated that the direction of a fragment traversing a layout shape clockwise may be determined and observed at the direction of the vector made from the starting point of the fragment to the finishing point of the fragment. This may be done either in the individual cell in the hierarchy or on a flattened layout basis. Classes of directional orientations may include: a group encompassing top, bottom, right and left for edges that are in the orthogonal plane. Diagonal edge fragments (e.g., for lines of 450) may be classified in discrete directions, however, for illustrative purposes, such diagonal edge fragments are classified into four quadrants. Illustrated in FIG. 1 and FIG. 3 are examples of four such directional orientations, namely: a first quadrant 12, a second quadrant 14, a third quadrant 16 and a fourth quadrant 18 where, an angle, α, defines the directional orientation of an edge fragment such that: $0° \leq \alpha < 90°$, $90° \leq \alpha < 180°$, $180° \leq \alpha < 270°$ and $270° \leq \alpha < 360°$. Alternatively, edge fragments may be classified into two quadrants, such that: $0° \leq \alpha < 180°$; and $180° \leq \alpha < 360°$. By classifying/tagging and grouping edge fragments according to directional orientations, the edge fragments may be adjusted sequentially through the groups. Mask rule checks (MRC) are incorporated as part of the iterative procedure during or immediately after the shift of each group of edge fragments. The iteration procedure alternates between edge fragments belonging to different directional orientation groups. For MRC executed during the shift, the complexity of an extra repair step may be avoided following edge fragment movements.

The degree of adjustment in each iteration is based on an edge placement error (EPE). The EPE varies from one edge to another edge and is calculated based on the original position of an edge for the first iteration. In subsequent iterations, the EPE is based on the most recent position of the edge. Alternatively, the EPE from an opposing edge is also incorporated in the iteration procedure irrespective of whether that opposing edge is subjected to an iterative shift. This is performed by having the EPE of one edge fragment from one set calculated and combined with the EPE of an opposing edge fragment from another set, this combined feedback/EPE is then applied to shift the position of the edge fragment with respect to the opposing edge fragment. The opposing edge may not be subject to a shift. This combined feedback/EPE may provide greater accuracy in the iterations and may be applied for fine adjustments, discussed in subsequent paragraphs.

The iterative procedure may be divided into different categories. When the iteration is conducted on an edge fragment of a single directional orientation, the EPE is based on a single edge, the iterative procedure is known as a single sided compass method. The iteration procedure may be conducted on edge fragments from two mutually exclusive sets of different directional orientations. Such an iterative procedure is referred to as a dual sided compass method. For example, edge fragments from the two mutually exclusive sets of designated directional orientation top and left may be combined such that the EPE is based on the combined EPE of the edge fragments from the respective groups. However, edge fragments of opposing directional orientation may not be combined in the same OPC iteration, for example, edge fragments of top and bottom directional orientation are grouped separately with edge fragment of directional orientation top or left. Likewise for edge fragments of the opposing directional orientation left and right. Where the iterative procedure is based on edge fragments in non-overlapping quadrants/orientation, the iterative procedure is referred to as single quadrant compass method. The determination of these iterative categories is incorporated in process step 103 of the algorithm 30 in FIG. 2. Further illustrations of these categories are discussed in FIG. 4a-4d.

FIG. 3 shows, an embodiment of the present invention, a critical segment 20 of fragment 10 in the circuit design layout. Using the simple directional orientation classification of "top", "bottom", "left" and "right", the edges 21a-21h, collectively referred to as 21, are classified and grouped under the directional orientation of "top", the edges 22a-22c, collective referred to as 22, are classified and grouped with a directional orientation of "bottom", edges 23a-23b collective referred to as 23, are classified and grouped under the directional orientation of "left" and edges 24a-24d, collective referred to as 24, are classified and grouped under the directional orientation of "right". Specifically, "top" edges 21 and "bottom" edges 22 shift in a vertical direction while "left" edges 23 and "right" edges 24 shift in a horizontal direction. The directions within each directional orientation classifications are non-opposing. The directions of the edges in fragment 10 of the circuit design layout is determined by comparing directions parallel to the fragments as traversed in a clockwise direction, or by looking at the direction of a vector pointing toward the outside of a circuit design layout shape at the fragment. Thus the direction of top edges is in opposite direction to bottom edges, and similarly for left edges and right edges. Likewise edges at angle alpha, α, are in opposing directions to edges at angle alpha plus 180 degrees (i.e., α+180°).

Other edges 28a-28e and 29a-29c, that do not fall within a distinctly horizontal or vertical orientation may be classified and grouped according to an angle, α, that falls within the first quadrant, second quadrant, third quadrant or fourth quadrant where $0 \leq \alpha < 90$, $90 \leq \alpha < 180$, $180 \leq \alpha < 270$ and $270 \leq \alpha < 360$, respectively, as illustrated in FIG. 1. Alternatively, such edge fragments may also be classified into groups that fall within the combined quadrants where $0° \leq \alpha < 180°$; and $180° \leq \alpha < 360°$.

With the edges respectively classified/tagged, at any point in time, an edge from a group of a particular directional orientation is proximally shifted by a current edge placement error (EPE), calculated on the basis of the immediately preceding position of the particular edge that is to be shifted. As shown in FIG. 3, for example, edge 21a, is shifted by an EPE calculated based on its position just before shifting. The same process steps are applied to an edge of other directional orientations, for example, an edge fragment 23a. Following which the process steps are applied on edge fragment 22a before moving on to edge fragment 24a. The calculation of the EPE and shifting of the edge is repeated for another edge 24a of the group 24 of directional orientation "right". Similarly, this process step is repeated for edges of directional orientation 28 and 29. The process of calculating, shifting and updating the positions of each respectively shifted edge is carried out in an alternating manner, as shown in FIG. 2 in process steps 102, 105, 203, 103, where no two edges of opposite directional orientation are shifted in consecutive succession. The same iterative procedure is repeated with edges 21b, 23b, 22b, 24b, 28b and 29b after which the iterative procedure is repeated with edges 21c, 23c, 22c, 24c, 28c, 29c, etc.

The iterative procedure ceases when each edge of the respective directional orientation groups has been shifted such that a pre-defined limit is attained, shown in process step 108 in FIG. 2. This limitation may be a certain target edge, a certain range of line width, certain range of spacing between lines or a pre-defined convergence limit. The iterative procedure may alternate about all the edges classified under the six directional orientation groups 21, 22, 23, 24, 28, and 29, illustrated in FIG. 3. Alternatively, the iterations may be applied to only selected edges and the limitations for a particular series of iterations of a selected number of edges may differ from another selected number of edges. For example, the edges of a critical segment may be subjected to a higher number of iterations and more stringent limitations compared to edges that are situated in a less critical area on the circuit design layout. The flexibility of setting different limitations also enable fine adjustments, which is discussed in later paragraphs.

Figure 4A:
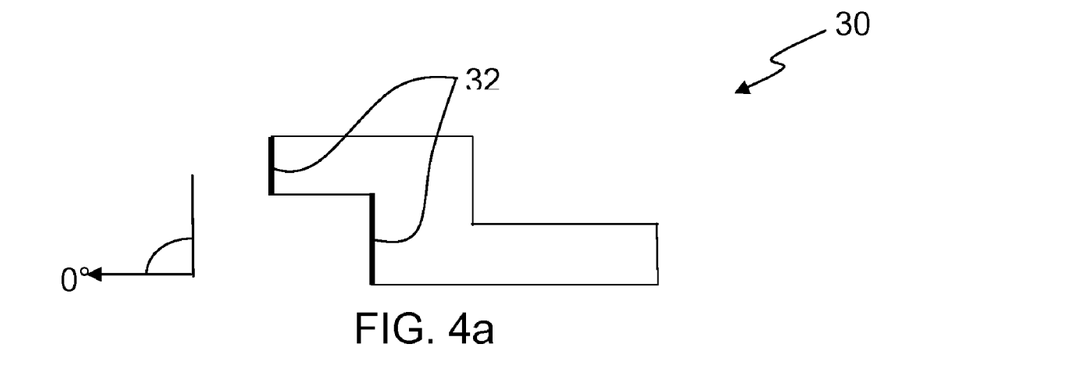
FIG. 4a-4d is plan view of a series of segments of a particular fragment in an embodiment of the present invention.
Figure 4B:
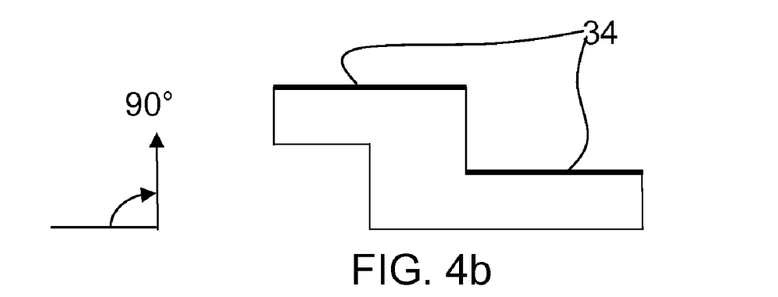
Figure 4C:
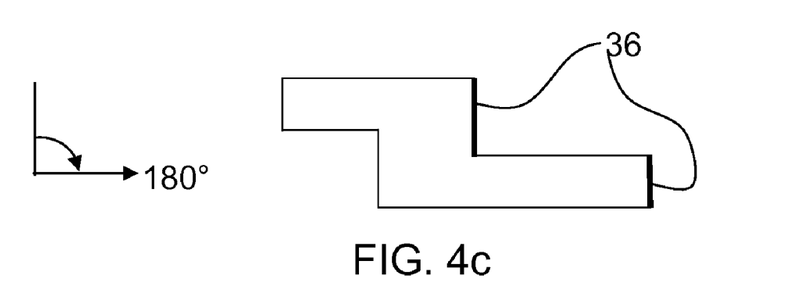
Figure 4D:
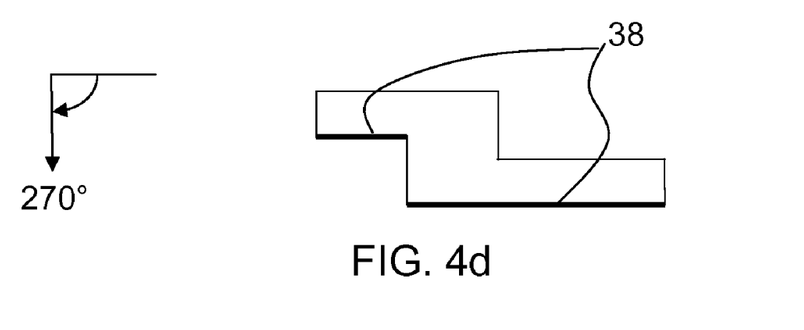

The iterative procedure of the present invention, a proximity iteration strategy, is explained in greater detail, according to the illustrations in FIG. 4a-4d, where each figure illustrates a group of edges of a particular directional orientation. FIG. 4a shows edges 32 classified under the first quadrant at 0°, parallel to the normal. FIG. 4b shows edges 34 classified under the second quadrant at 90° perpendicular to the normal). FIG. 4c shows edges 36 classified under the third quadrant at 180° where the edges are parallel to the normal. FIG. 4d shows edges 38 classified as in the fourth quadrant and perpendicular to the normal. The respective edges may also be classified under the directional orientation of left, top, right and bottom, respectively. The respective edges in their assigned directional orientations can shift in either direction vertically (i.e., edges classified under "Top" and "Bottom" may shift up or down) or horizontally (i.e., edges classified under "Left" and "Right" may shift left or right). Edges of other directional orientation may fall within a particular quadrant that forms an angle α, where $0 \leq \alpha < 90$ in the first quadrant, $90 \leq \alpha < 180$ in the second quadrant, $180 \leq \alpha < 270$ in the third quadrant and $270 \leq \alpha < 360$ in the fourth quadrant. The iterations of the edges alternate amongst themselves such that each iteration of an edge fragment of any directional orientation takes into account the change in position of the edge fragments of other directional orientations previously iterated. As the changes are of a smaller aerial scale, the discrete limit cycle behavior is reduced so that the iterative system is able to maintain a steady state of turbulence.

Alternative to the proximity iteration strategy illustrated in FIG. 4a-4d, where an edge fragment is shifted on the basis of its own EPE, the present invention may be applied in a manner such that edge fragments are divided into two fragments classifications: $0° \leq \alpha < 180°$ and $180° \leq \alpha < 360°$; shifting the fragments in the classification where $0° \leq \alpha < 180°$ on the basis of the EPE of the selected edge fragment and adding the EPE of the fragment on the opposing side of the feature and within some distance. The fragment on the opposing side of the feature does not move in this iteration. If desired, the iteration may be repeated by switching the fragment categories. As before, this alternative iterative strategy may be combined with any of the previous methods.

In an alternative embodiment of the present invention, the dual sided compass method may be practiced on edge fragments of non-opposing directional orientations. It is understood that while the EPE of the combined edge fragments is used for shifting of the edge fragments, fine adjustment of such iterations may be possible by use of an optical rule checking (ORC) EPE histogram to ascertain the convergence or fit with a target fragment. An example of such a histogram is that of the differences of the final line width and the target line width. Alternatively, a histogram of the final line width or a histogram of the original line widths may also be used.

In yet another alternative embodiment of the present invention, fine adjustment in the iterative procedure is made possible by restricting line widths to fall within a certain range targeting lines on or below the nominal width. For critical line widths, edge fragments are tagged to a particular quadrant that is opposite a quadrant for line width adjustments. The edge fragments on opposite sides of a feature are paired and the EPE of the opposing edge fragments are combined. The iterative procedure is conducted on edge fragments belonging to a particular directional orientation with combined EPE to adjust the spacing there between. Similar to the fine adjustment of critical line widths, restrictions can be made to spacing by setting a certain range where the focus is on critical edges. Fine adjustments can be performed on the line width and spacing simultaneously or sequentially by combining EPE error from opposing directions; for example, by adjusting the edge fragments associated with the spacing adjustment first and then the fragments associated with the line width adjustment.

The present invention may be applied in concert with conventional OPC or other forms of OPC methods either prior to or as a follow-up iterative procedure as a measure of fine adjustments; or applied only at specific features or fragments that are considered critical such as fragments touching a gate. The iterative procedure allows for non-critical fragments to remain while selected critical features or fragments are subject to the iterative procedure.

Figure 5:
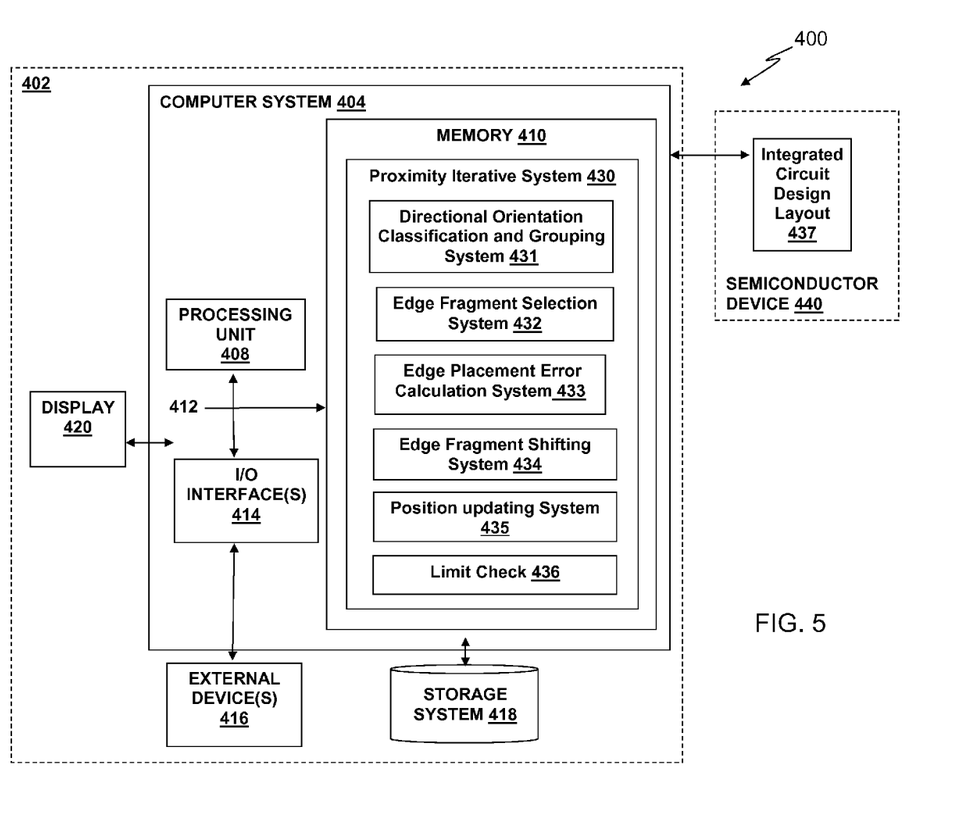
FIG. 5 is a block diagram of a computer system according to an embodiment of the present invention.

Another embodiment of the present invention is illustrated in FIG. 5, which shows an illustrative system 400 for refining an integrated circuit (IC) design layout through classifying edge fragments by directional orientations in a proximity iterative procedure in accordance with embodiment(s) of the present invention. To this extent, the system 400 includes a computer infrastructure 402 that can perform the various process steps described herein for refining an integrated circuit design layout. In particular, the computer infrastructure 402 is shown including a computer system 404 that comprises a proximity iterative system 430, which enables the computer system 404 to classify all edge fragments of an IC layout by directional orientation, calculate the edge placement errors and proximally shift the edge fragments by performing the process steps of the invention.

The computer system 404 as shown includes a processing unit 408, a memory 410, at least one input/output (I/O) interface 414, and a bus 412. Further, the computer system 404 is shown in communication with at least one external device 416 and a storage system 418. In general, the processing unit 408 executes computer program code, such as a proximity iterative system 430, that is stored in memory 410 and/or storage system 418. While executing computer program code, the processing unit 408 can read and/or write data from/to the memory 410, storage system 418, and/or I/O interface(s) 414. Bus 412 provides a communication link between each of the components in the computer system 404. The at least one external device 416 can comprise any device (e.g., display 420) that enables a user (not shown) to interact with the computer system 404 or any device that enables the computer system 404 to communicate with one or more other computer systems.

In any event, the computer system 404 can comprise any general purpose computing article of manufacture capable of executing computer program code installed by a user (e.g., a personal computer, server, handheld device, etc.). However, it is understood that the computer system 404 and proximity iterative system 430 are only representative of various possible computer systems that may perform the various process steps of the invention. To this extent, in other embodiments, the computer system 404 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, the computer infrastructure 402 is only illustrative of various types of computer infrastructures that can be used to implement the invention. For example, in one embodiment, the computer infrastructure 402 comprises two or more computer systems (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Regardless, communications between the computer systems may utilize any combination of various types of transmission techniques.

As previously mentioned, the proximity iterative system 430 enables the computer system 404 to perform a limit check 436 when an IC design layout 437 is refined through the proximity iterative procedure. The IC design layout 437 being optically projected onto a wafer 440. To this extent, the proximity iterative system 430 is shown as including a directional orientation classification and grouping system 431 for determining, classifying and grouping edge fragments according to directional orientation; an edge fragment selection system 432 for selecting an edge fragment and ascertaining that each selected edge fragment is of a different directional orientation from the preceding edge fragment; an edge placement error (EPE) calculation system 433 for calculating an EPE according to the position of the selected edge fragment(s); and edge fragment shifting system 434 for proximally shifting the selected edge fragment; a position updating system 435 for updating the position of an iterated edge fragment; and limit check 436 for verifying that the desired target has been attained such that the iterative procedure of the proximity iterative system can come to an end. It is understood that some of the various systems shown in FIG. 5 can be implemented independently, combined, and/or stored in memory for one or more separate computer systems 404 that communicate over a network. Further, it is understood that some of the systems and/or functionality may not be implemented, or additional systems and/or functionality may be included as part of the system 400.

While shown and described herein as a method and system for refining an integrated circuit (IC) design layout through classifying edge fragments by directional orientations in a proximity iterative procedure, it is understood that the invention further provides various alternative embodiments. For example, in one embodiment, the invention provides a computer-readable medium that includes computer program code to enable a computer infrastructure to conduct a proximity iterative procedure that will refine an IC layout in a photolithographic process of creating a mask. To this extent, the computer-readable medium includes program code, such as the proximity iterative system 430, which implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computer system, such as the memory 410 and/or storage system 418 (e.g., a fixed disk, a read-only memory, a random access memory, a cache memory, etc.), and/or as a data signal traveling over a network (e.g., during a wired/wireless electronic distribution of the program code).

In another embodiment, the invention provides a business method that performs the process steps of the invention on a subscription, advertising, and/or fee basis. That is, a service provider could offer to perform the iterative procedure for refining an integrated circuit (IC) design layout through classifying edge fragments by directional orientations. In this case, the service provider can create, maintain, support, etc., a computer infrastructure, such as the computer infrastructure 402 that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of refining an integrated circuit (IC) design layout through a proximity iterative procedure classifying edge fragments by directional orientations. In this case, a computer infrastructure, such as the computer infrastructure 402, can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computer system, such as the computer system 404, from a computer-readable medium; (2) adding one or more computer systems to the computer infrastructure; and (3) incorporating and/or modifying one or more existing systems of the computer infrastructure, to enable the computer infrastructure to perform the process steps of the invention.

As used herein, it is understood that the terms "program code" and "computer program code" are synonymous and mean any expression, in any language, code or notation, of a set of instructions intended to cause a computer system having an information processing capability to perform a particular function either directly or after either or both of the following: (a) conversion to another language, code or notation; and (b) reproduction in a different material form. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An iterative optical proximity correction (OPC) method for refining an integrated circuit (IC) layout, the IC layout having a plurality of edge fragments, the method comprising:
   determining a directional orientation of each edge fragment;
   grouping edge fragments of the same directional orientation to form mutually exclusive directional orientation sets;
   selecting an edge fragment from one of the mutually exclusive sets;
   calculating an edge placement error (EPE) of the selected edge fragments;
   shifting the selected edge fragment based on the calculated EPE to a new position;
   updating the orientation of the shifted edge fragment;
   selecting an edge fragment from another one of the mutually exclusive sets; and reiterating calculating the EPE of the edge fragment, shifting edge fragment and updating orientation and selecting of an edge of a different directional orientation to attain a predetermined limit;

wherein the reiterating calculating the EPE of the edge fragment alternates between mutually exclusive sets; and wherein the mutually exclusive sets contain edge fragments of non-opposing directional orientation.

2. The method according to claim 1, wherein each of the mutually exclusive directional orientation sets is selected from a group consisting of: top, bottom, left and right.

3. The method according to claim 1, wherein each of the mutually exclusive directional orientation sets, defined by an angle, $\alpha$, is selected from a group consisting of: $0° \leq \alpha < 90°$, $90° \leq \alpha < 180°$, $180° \leq \alpha < 270°$ and $270° \leq \alpha < 360°$.

4. The method according to claim 1, further comprising combining at least two mutually exclusive directional orientation sets, wherein the at least two mutually exclusive directional orientation sets include edge fragments of non-opposing directional orientations.

5. The method according to claim 4, wherein each of the combined mutually exclusive directional orientation sets is selected from a group consisting of: top-left, bottom-right, top-right and bottom-left.

6. The method according to claim 4, wherein each of the mutually exclusive directional orientation sets, defined by an angle, $\alpha$, is selected from a group consisting of: $0° \leq \alpha < 180°$ and $180° \leq \alpha < 360°$.

7. The method according to claim 1, further comprising calculating the EPE of the selected edge fragment by incorporating an EPE from an edge fragment of opposing directional orientation.

* * * * *